United States Patent
Yamazaki et al.

(10) Patent No.: US 8,962,456 B2
(45) Date of Patent: Feb. 24, 2015

(54) GROUP III NITRIDE SEMICONDUCTOR SINGLE CRYSTAL, METHOD FOR PRODUCING THE SAME, SELF-STANDING SUBSTRATE, AND SEMICONDUCTOR DEVICE

(71) Applicant: Toyoda Gosei Co., Ltd., Kiyosu-shi (JP)

(72) Inventors: Shiro Yamazaki, Kiyosu (JP); Miki Moriyama, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 27 days.

(21) Appl. No.: 13/952,480

(22) Filed: Jul. 26, 2013

(65) Prior Publication Data

US 2014/0070370 A1    Mar. 13, 2014

(30) Foreign Application Priority Data

Sep. 10, 2012 (JP) ................. 2012-198663

(51) Int. Cl.
| | | |
|---|---|---|
| H01L 21/20 | (2006.01) | |
| H01L 21/36 | (2006.01) | |
| H01L 29/20 | (2006.01) | |
| C30B 9/12 | (2006.01) | |
| C30B 29/64 | (2006.01) | |
| C30B 29/40 | (2006.01) | |
| H01L 29/66 | (2006.01) | |
| H01L 29/778 | (2006.01) | |
| H01L 29/78 | (2006.01) | |
| C30B 9/10 | (2006.01) | |
| C30B 19/02 | (2006.01) | |
| C30B 19/06 | (2006.01) | |
| C30B 19/10 | (2006.01) | |
| H01L 33/00 | (2010.01) | |

(52) U.S. Cl.
CPC . *C30B 9/12* (2013.01); *C30B 29/64* (2013.01); *C30B 29/406* (2013.01); *H01L 29/66462* (2013.01); *H01L 29/7786* (2013.01); *H01L 29/66734* (2013.01); *H01L 29/7813* (2013.01); *C30B 9/10* (2013.01); *C30B 19/02* (2013.01); *C30B 19/06* (2013.01); *C30B 19/10* (2013.01); *C30B 29/403* (2013.01); *H01L 29/2003* (2013.01); *H01L 33/0075* (2013.01)
USPC ............................ 438/478; 438/503; 257/615

(58) Field of Classification Search
USPC ........................................... 438/503; 257/615
See application file for complete search history.

(56) References Cited

U.S. PATENT DOCUMENTS 5,876,495 A * 3/1999 Hiraishi et al. .................. 117/20
5,938,841 A * 8/1999 Kitagawa et al. ............. 117/208

(Continued)

FOREIGN PATENT DOCUMENTS

| JP | 2007-238343 A | 9/2007 |
| JP | 2010-168236 A | 8/2010 |

(Continued)

*Primary Examiner* — Lex Malsawma

(74) *Attorney, Agent, or Firm* — McGinn IP Law Group, PLLC

(57) ABSTRACT

Objects of the present invention are to provide a method for producing a Group III nitride semiconductor single crystal, which method enables production of a Group III nitride semiconductor single crystal having a flat surface by means of a crucible having any inside diameter; to provide a self-standing substrate obtained from the Group III nitride semiconductor single crystal; and to provide a semiconductor device employing the self-standing substrate. The production method includes adding the template, a flux, and semiconductor raw materials to a crucible and growing a Group III nitride semiconductor single crystal while the crucible is rotated. In the growth of the semiconductor single crystal, the crucible having an inside diameter R (mm) is rotated at a maximum rotation speed ω (rpm) satisfying the following conditions:

$\omega 1-4 \leq \omega \leq \omega 1+4$;

$\omega 1 = 10^z$; and $z = -0.78 \times \log_{10}(R) + 3.1$.

16 Claims, 5 Drawing Sheets

(56) References Cited

U.S. PATENT DOCUMENTS

| | | | |
|---|---|---|---|
| 7,833,346 B2 * | 11/2010 | Imaeda et al. | 117/64 |
| 7,842,133 B2 | 11/2010 | Iwai et al. | |
| 8,501,141 B2 * | 8/2013 | Sato et al. | 423/409 |
| 2007/0084399 A1 * | 4/2007 | Sarayama et al. | 117/73 |
| 2009/0000538 A1 | 1/2009 | Iwai et al. | |
| 2010/0247418 A1 * | 9/2010 | Sato et al. | 423/409 |
| 2011/0011333 A1 * | 1/2011 | Imaeda et al. | 117/208 |
| 2013/0069078 A1 * | 3/2013 | Sarayama et al. | 257/76 |

FOREIGN PATENT DOCUMENTS

| | | |
|---|---|---|
| JP | 2011-230966 A | 11/2011 |
| WO | WO 2007/102610 A1 | 9/2007 |

* cited by examiner

GROUP III NITRIDE SEMICONDUCTOR SINGLE CRYSTAL, METHOD FOR PRODUCING THE SAME, SELF-STANDING SUBSTRATE, AND SEMICONDUCTOR DEVICE

BACKGROUND OF THE INVENTION

1. Field of the Invention

The present invention relates to a Group III nitride semiconductor single crystal, to a method for producing the same, to a self-standing substrate, and to a semiconductor device. More particularly, the present invention relates to a Group III nitride semiconductor single crystal produced through a flux process, to a method for producing the same, to a self-standing substrate, and to a semiconductor device.

2. Background Art

Semiconductor crystals are produced through vapor-phase growth methods such as metal-organic chemical vapor deposition (MOCVD) and hydride vapor phase epitaxy (HVPE); molecular beam epitaxy (MBE); and liquid-phase epitaxy. One liquid-phase epitaxy technique is a flux process employing Na flux.

In a general procedure of the flux process, a gallium nitride (GaN) layer is formed on a sapphire substrate or a like substrate, to thereby prepare a seed-crystal substrate, and a semiconductor single crystal is grown on the seed-crystal substrate. In this case, the seed-crystal substrate, raw materials of the semiconductor single crystal, and a flux are placed in a crucible, and then the semiconductor single crystal is grown while the temperature and pressure inside the reaction chamber are controlled. There is disclosed a technique for transferring nitrogen gas from the vapor-liquid interface to the inside of the melt through stirring the melt (see, for example, paragraph [0003], Table 1, etc. of Patent Document 1).
Patent Document 1: Japanese Patent Application Laid-Open (kokai) No. 2010-168236

Meanwhile, for producing a single-crystal substrate having a large diameter, a crucible having a large inside diameter enough for the diameter of the substrate must be employed. In the case where a crucible is rotated at a given rotation speed, the centrifugal force applied to the molten liquid present in the vicinity of the inner wall of the crucible varies in accordance with the inside diameter of the crucible. That is, during rotation of the crucible, the surface level of the molten liquid present in the vicinity of the inner wall rises, as the inside diameter of the crucible increases.

In one case, a semiconductor single crystal having a flat surface can be produced through rotating, at a predetermined rotation speed, a crucible having a small inside diameter. However, when a semiconductor single crystal is grown through rotation, at the same rotation speed, of a crucible having a larger inside diameter, the obtained semiconductor single crystal has an indented center part. Thus, even when the rotation speed is tuned so as to suitably grow a semiconductor single crystal, the surface of the semiconductor single crystal may be flat or non-flat, depending on the diameter of the employed crucible. Therefore, difficulty is encountered in growth of a semiconductor single crystal having a large diameter and having a flat surface.

SUMMARY OF THE INVENTION

The present invention has been conceived to solve the problem involved in the aforementioned conventional technique. Thus, an object of the present invention is to provide a method for producing a Group III nitride semiconductor single crystal, which method enables production of a Group III nitride semiconductor single crystal having a flat surface by means of a crucible having any inside diameter. Another object is to provide a Group III nitride semiconductor single crystal produced through the method. Yet another object is to provide a self-standing substrate obtained from the Group III nitride semiconductor single crystal. Still another object is to provide a semiconductor device employing the self-standing substrate.

Accordingly, in a first aspect of the present invention, there is provided a method for producing a Group III nitride semiconductor single crystal through use of a flux for growing a Group III nitride semiconductor single crystal. The method comprises adding a seed-crystal substrate, a flux, and semiconductor raw materials into a crucible and growing a Group III nitride semiconductor single crystal while the crucible is rotated. In the growth of the semiconductor single crystal, the crucible having an inside diameter R (mm) is rotated at a maximum rotation speed $\omega$ (rpm) satisfying the following conditions:

$$\omega 1 - 4 \leq \omega \leq \omega 1 + 4;$$

$$\omega 1 = 10^z; \text{ and}$$

$$z = -0.78 \times \log_{10}(R) + 3.1.$$

In the method for producing a Group III nitride semiconductor single crystal, the maximum rotation speed $\omega$ (rpm) of the crucible during growth of a semiconductor single crystal is modulated in accordance with the inside diameter R (mm) of the crucible. Specifically, the maximum rotation speed $\omega$ is reduced as the inside diameter R of the crucible increases. Through this modulation, an increase in height of the molten liquid present in the vicinity of the inner wall of the crucible, and a decrease in height of the molten liquid at the center of the crucible can be prevented during growth of a semiconductor single crystal. The thus-grown semiconductor single crystal virtually has no indented area at the center, meaning that a flat semiconductor single crystal can be obtained. Notably, there has not been clearly elucidated the relationship between the height of the molten liquid and the film thickness profile of the grown semiconductor single crystal. However, one conceivable factor is the flow of molten liquid in the vicinity of the growth surface of the seed crystal. The correlation of the height of the molten liquid with the film thickness profile of the semiconductor single crystal which has been established in the actually conducted experiments will be described hereinbelow.

In a second aspect of the method for producing a Group III nitride semiconductor single crystal, the growth of the semiconductor single crystal includes a constant speed rotation period in which the crucible is rotated at a constant rotation speed satisfying the following condition:

$\omega 1 - 4 \leq \omega \leq \omega 1 + 4$. In the constant speed rotation period, the rotation speed is maintained constantly at high level, whereby the molten liquid can be suitably stirred for growth of a semiconductor single crystal.

In a third aspect of the method for producing a Group III nitride semiconductor single crystal, in the constant speed rotation period, the crucible is rotated at a constant rotation speed satisfying the following condition:

$\omega 1 - 2 \leq \omega \leq \omega 1 + 2$. Thus, the molten liquid can be more suitably stirred.

In a fourth aspect of the method for producing a Group III nitride semiconductor single crystal, the method comprises, before the growth of the semiconductor single crystal, forming a seed layer on a substrate, to thereby provide a seed-crystal substrate. Since the seed-crystal substrate has a seed layer, a semiconductor single crystal can be suitably grown.

In a fifth aspect of the method for producing a Group III nitride semiconductor single crystal, the period of rotating the crucible includes:

an acceleration period in which the rotation speed is accelerated to the speed of the constant speed rotation period;

a rotation suspension period in which rotation of the crucible is suspended; and a speed reduction period in which the rotation speed is reduced from the speed of the constant speed rotation period. In the rotation suspension period, the crucible rotation speed is substantially zero.

In a sixth aspect of the present invention, there is provided a Group III nitride semiconductor single crystal, which has been grown in a crucible through a flux process. The crucible having an inside diameter R (mm) is rotated at a maximum rotation speed ω (rpm) satisfying the following conditions:

$$\omega 1-4 \leq \omega \leq \omega 1+4;$$

$$\omega 1 = 10^z; \text{ and}$$

$z=-0.78 \times \log_{10}(R)+3.1$. The single crystal has a diameter of 130 mm or more. The Group III nitride semiconductor single crystal is a flat surface.

In a seventh aspect of the present invention, there is provided a Group III nitride semiconductor single crystal which has a diameter of 170 mm or less. The Group III nitride semiconductor single crystal is a flat surface.

In an eighth aspect of the present invention, there is provided a self-standing substrate formed by polishing at least one surface of the aforementioned Group III nitride semiconductor single crystal. The self-standing substrate has a sufficiently large diameter.

In a ninth aspect of the present invention, there is provided a semiconductor device which comprises:

the aforementioned self-standing substrate;

a Group III nitride semiconductor layer formed on the self-standing substrate; and an electrode which is in contact with the Group III nitride semiconductor layer or the self-standing substrate.

The present invention enables provision of a method for producing a Group III nitride semiconductor single crystal, which method can produce a Group III nitride semiconductor single crystal having a flat surface by means of a crucible having any inside diameter; a Group III nitride semiconductor single crystal produced through the method; a self-standing substrate obtained from the Group III nitride semiconductor single crystal; and a semiconductor device employing the self-standing substrate.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
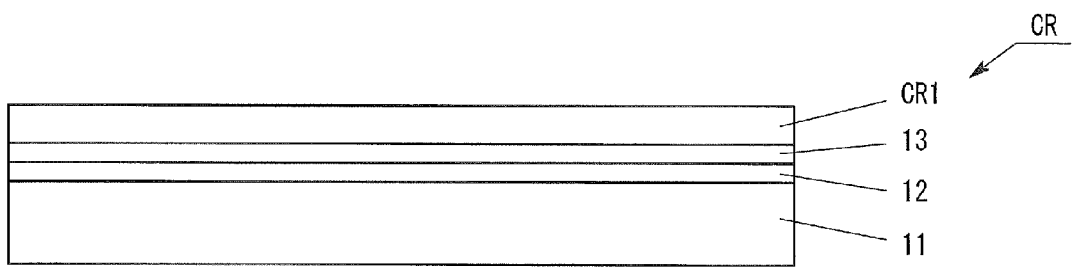
FIG. 1 is a cross-section of a Group III nitride semiconductor single crystal according to an Embodiment.

Specific embodiments of the present invention will next be described with reference to the drawings. The embodiments relate to a method for producing a Group III nitride semiconductor single crystal based on a flux process; a Group III nitride semiconductor single crystal produced through the method; a self-standing substrate obtained from the Group III nitride semiconductor single crystal; and a semiconductor device employing the self-standing substrate. These elements described in the embodiments are given for the only illustration purpose, and the present invention is not limited to the embodiments. The thickness of each layer which is schematically shown in the drawings does not correspond to its actual value.

Embodiment 1

1. Semiconductor Single Crystal

FIG. 1 shows a crystal CR according to Embodiment 1. As shown in FIG. 1, the crystal CR has a sapphire substrate 11, a buffer layer 12, a GaN layer 13, and a single crystal CR1. The single crystal CR1 is formed of a Group III nitride-based compound semiconductor. The single crystal CR1 is obtained by removing the sapphire substrate 11 and the other layers from the crystal CR.

2. Crystal Growth Apparatus

Figure 2:
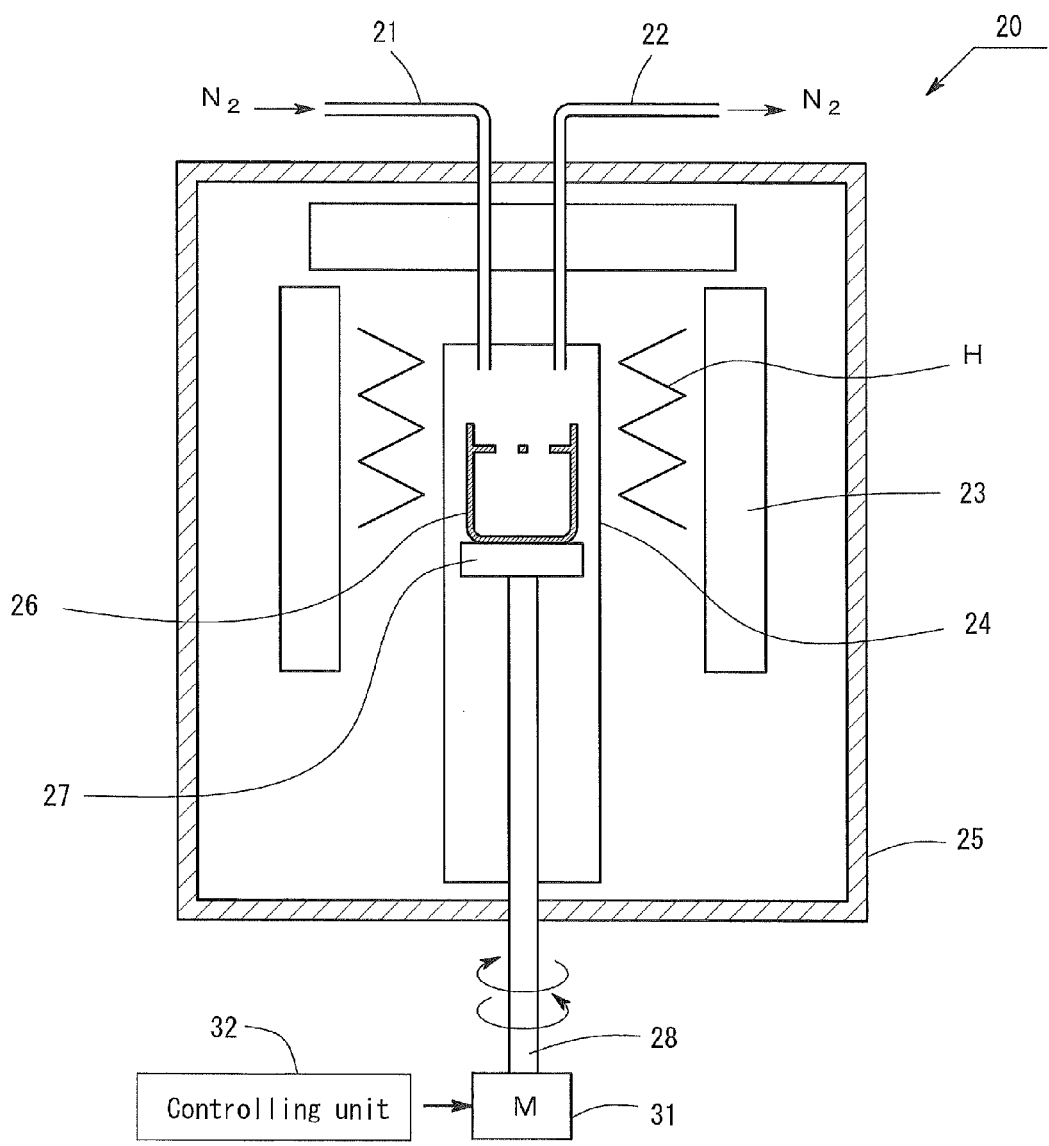
FIG. 2 is a schematic view of the structure of a crystal growth apparatus for producing a Group III nitride semiconductor single crystal according to the Embodiment.

FIG. 2 shows a crystal growth apparatus 20 according to Embodiment 1. The crystal growth apparatus 20 is employed for growth of a Group III nitride semiconductor single crystal on a growth substrate through a flux process. As shown in FIG. 2, the crystal growth apparatus 20 has a gas-feed pipe 21, a gas-discharge pipe 22, a thermal insulator 23, a reaction chamber 24, a pressure container 25, a turntable 27, a rotary shaft 28, a motor 31, a motor-controlling unit 32, and a heater H.

As shown in FIG. 2, in the crystal growth apparatus 20, a crucible 26 can be placed on the turntable 27. The crucible 26 can be simultaneously rotated with the turntable 27. The rotation center corresponds to the rotary shaft 28. The rotation speed of the crucible 26 may be regulated by regulating rotation of the motor 31. In Embodiment 1, the inside diameter of the crucible 26 correlates with the rotation speed of the crucible 26 during crystal growth. Details of the correlation will be described hereinbelow.

The pressure container 25 is adapted to accommodate the reaction chamber 24. The pressure container 25 is made of a material such as SUS. Needless to say, other materials may also be employed. The reaction chamber 24 is adapted to accommodate the crucible 26 and provides conditions for growth of a semiconductor single crystal.

The gas-feed pipe 21 is disposed for supplying nitrogen gas ($N_2$) into the reaction chamber 24. The gas-discharge pipe 22 is disposed for discharging nitrogen gas ($N_2$) from the reaction chamber 24. The inside pressure of the reaction chamber 24 can be tuned by means of the two pipes. The heater H is disposed to heat the inside of the pressure container 25 and the inside of the reaction chamber 24. The heater H can also control the inside temperature of reaction chamber 24. The thermal insulator 23 serves as a member that can prevent diffusion of heat from the inside of the reaction chamber 24 to the outside.

The turntable 27 serves as a base on which the crucible 26 is placed. Thus, the turntable 27 is disposed in the reaction chamber 24. The crucible 26 is made of alumina. Needless to say, other materials may also be employed. The rotary shaft 28 sustains the turntable 27 and transfers the power of the motor 31 to the turntable 27. The rotary shaft 28 receives the driving force of the motor 31 and serves as a rotation center.

The motor 31 serves as a rotational driving member for rotating the rotary shaft 28. The motor-controlling unit 32 controls rotation of the motor 31. The motor-controlling unit 32 controls the direction of rotation of the motor 31 as well as the rotation speed of the motor 31, and increase and decrease of the rotation speed of the motor 31. In other words, the motor-controlling unit 32 controls the rotation of the crucible 26 according to the rotation mode described hereinbelow.

Figure 3:
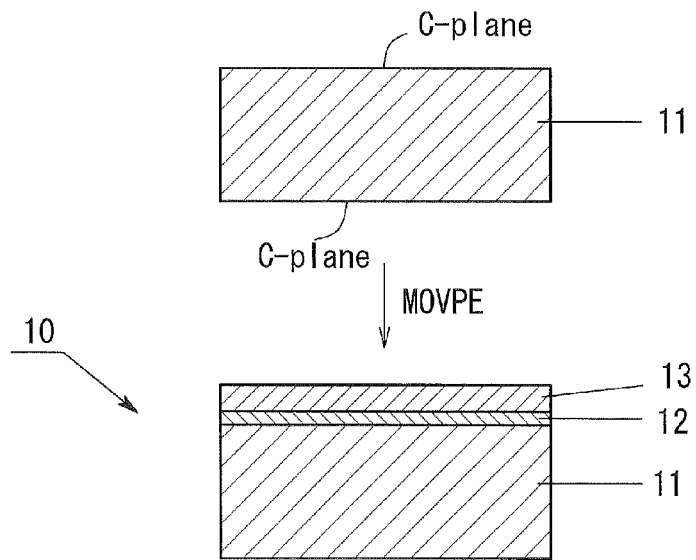
FIG. 3 is a representation showing a method of producing a seed-crystal substrate employed in the method for producing a Group III nitride semiconductor single crystal according to the Embodiment.

3. Method for Producing Group III Nitride Semiconductor Single Crystal 3-1. Forming Seed-Crystal Substrate The method for producing a semiconductor single crystal will next be described. As shown in FIG. 3, preparation of a template 10 will be described. The template 10 is a seed-crystal substrate used for growth of a semiconductor single crystal through a flux process. Firstly, a sapphire substrate 11 is provided. Through MOCVD, a buffer layer 12 is formed on the c-plane of the sapphire substrate 11. The buffer layer 12 is formed from a material such as AlN. The buffer layer 12 may be formed of TiN or GaN.

On the buffer layer 12, a GaN layer 13 is formed, to thereby prepare the template 10. The buffer layer 12 and the GaN layer 13 serve as a seed layer. However, when a GaN self-standing substrate (wafer) is used, no buffer layer 12 is required to be formed. The GaN layer 13, which is a GaN layer in this embodiment, may also be formed of AlGaN, InGaN, or AlInGaN. The GaN layer 13 undergoes melt-back in the flux under certain growth conditions. In this case, a portion of the GaN layer 13 dissolves in the flux.

3-2. Semiconductor Single Crystal Growth

Next, a semiconductor single crystal layer is formed on the template 10 through the flux process, which is a type of liquid-phase epitaxy. Table 1 shows raw materials employed for growth of the semiconductor single crystal. The Ga ratio is preferably adjusted to 30% or less. However, the Ga ratio may be in excess of 30%. The carbon ratio may vary within a range of 0 mol % to 2.0 mol %. That is, the flux may or may not optionally contain carbon. However, the carbon ratio is more preferably 0.01 mol % to 2.0 mol %. The values shown in Table 1 are only an example, and other values may be applied. In addition to these elements, a dopant element may be added.

The semiconductor single crystal to be grown is a Group III nitride semiconductor single crystal, such as GaN. Firstly, the template 10 and the raw materials shown in Table 1 are weighed in a glove box in which dew point and oxygen concentration are controlled. The values shown in Table 1 are only an example, and different values may be applied. Subsequently, the template 10, the raw materials, and the flux are added to the crucible 26. Then, the crucible 26 is placed on the turntable 27 of the reaction chamber 24. Thereafter, the pressure container 25 is evacuated, and then the pressure and temperature in the container are elevated. While the crucible 26 is rotated, a semiconductor single-crystal is grown.

TABLE 1

| Raw materials | Inside diameter of crucible (59 mm) | Inside diameter of crucible (180 mm) |
| --- | --- | --- |
| Ga | 11 g | 103 g |
| Na | 17 g | 160 g |
| C | 0.1 mol % to 2.0 mol % (with respect to Na) | |

Table 2 shows conditions in the crucible employed for in the growth of a semiconductor single crystal. The temperature is adjusted to 870° C., and the pressure is adjusted to 3 MPa. The inside diameter of the crucible 26 is, for example, 59 mm. In this case, the rotation speed of the crucible 26 is adjusted to 54 rpm. As described hereinbelow, in Embodiment 1, the rotation speed of the crucible 26 is adjusted to a value corresponding to the inside diameter of the crucible 26. The growth time is about 100 hours.

TABLE 2

| | |
| --- | --- |
| Temperature | 850° C. to 900° C. |
| Pressure | 3 MPa to 10 MPa |
| Stirring speed | 0 rpm to 100 rpm (in accordance with crucible inside diameter) |
| Growth time | 20 to 200 hours |

4. Rotation Speed of Crucible 4-1. Rotational Mode of Crucible

As described above, in the growth of a semiconductor single crystal, a semiconductor single crystal is grown under rotation of the crucible 26. One characteristic feature of Embodiment 1 resides in that the crucible 26 is rotated at a specific rotation speed. In Embodiment 1, the rotation speed ω of the crucible 26 is regulated in accordance with the inside diameter R of the crucible 26.

Figure 4:
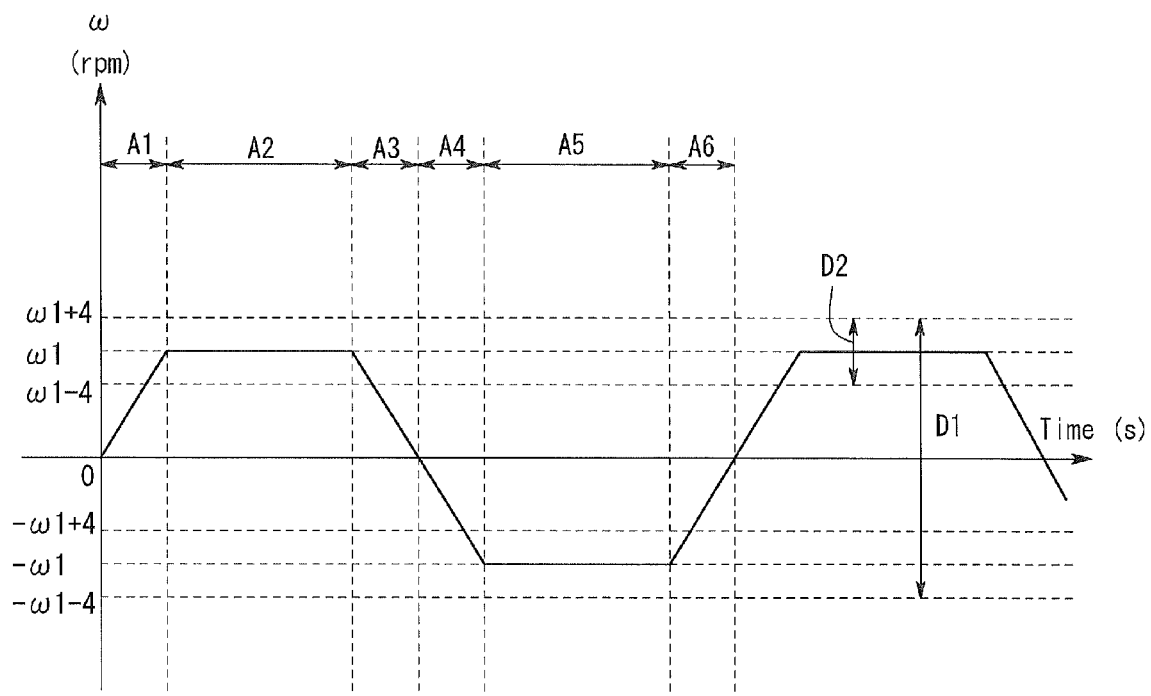
FIG. 4 is a graph showing the rotational mode of the crucible in the growth of a semiconductor single crystal included in the method for producing a Group III nitride semiconductor single crystal according to the Embodiment.

The rotational mode of the crucible 26 employed in Embodiment 1 is shown in FIG. 4. As shown in FIG. 4, the rotational mode of the crucible 26 includes alternating repetition of forward rotation and reverse rotation. In the present specification, the rotation speed of the crucible 26 in the forward direction is represented with a sign "+," and that in the reverse direction with a sign "−."

As shown in FIG. 4, the stirring period includes an acceleration period A1, a constant speed rotation (forward direction) period A2, a speed reduction period A3, an acceleration period A4, a constant speed rotation (reverse direction) period A5, and a speed reduction period A6. In the growth of a semiconductor single crystal, the cycle is continuously performed. As used herein, the term "acceleration" refers to increasing the absolute value of the rotation speed of the crucible 26, and the term "speed reduction" refers to reducing the absolute value of the rotation speed of the crucible 26.

In the acceleration period A1, the rotation speed ω of the crucible 26 is increased to a rotation speed ω1. In the constant speed forward rotation period A2, the crucible 26 is rotated at a constant speed ω1. In the speed reduction period A3, the rotation speed ω of the crucible 26 is reduced from the rotation speed ω1. In the acceleration period A4, the rotation speed ω of the crucible 26 is increased to a rotation speed −ω1. In the constant speed reverse rotation period A5, the crucible 26 is rotated at a constant speed −ω1. In the speed reduction period A6, the rotation speed ω of the crucible 26 is reduced from the rotation speed −ω1.

As shown in FIG. 4, the absolute value of the rotation speed (ω1) in the constant speed forward rotation period A2 is equal to the absolute value of the rotation speed (−ω1) in the constant speed reverse rotation period A5. The absolute value of the rotation speed (ω1) in the constant speed forward rotation period A2 corresponds to the maximum rotation speed of the crucible 26. Similarly, the absolute value of the rotation speed (−ω1) in the constant speed reverse rotation period A5 corresponds to the maximum rotation speed of the crucible 26. Thus, in Embodiment 1, the absolute value of the rotation speed (ω1) of the crucible 26 in the constant speed forward rotation period A2 is equivalent to that of the rotation speed (−ω1) of the crucible 26 in the constant speed reverse rotation period A5.

Note that the acceleration period A1, the speed reduction period A3, the acceleration period A4, and the speed reduction period A6 have the same length. The constant speed forward rotation period A2 and the constant speed reverse rotation period A5 have the same length. The ratio ((length of A2)/(length of A1)) of length of constant speed forward rotation period A2 to length of the acceleration period A1 is 0.5 to 2.5. Needless to say, the aforementioned predetermined values are merely examples, and other values may also be employed.

4-2. Crucible Rotation Speed

The centrifugal force applied to a microvolume ΔV of the molten liquid in the crucible 26 can be estimated by the following formula:

$$(½) \times \rho \times \Delta V \times r \times \omega^2, \text{ wherein}$$

ρ: density of molten liquid;
ΔV: microvolume of molten liquid;
r: distance from the rotation center of the crucible to the center of gravity of the microvolume; and
ω: rotation speed of the crucible. Thus, the greater the distance r from the rotation center of the crucible 26, the greater the centrifugal force applied to the microvolume ΔV of the molten liquid in the crucible 26. In the above estimation, the density ρ of the molten liquid is assumed to be uniform.

Thus, the liquid surface of the molten liquid generally assumes a paraboloid of revolution. In other words, the greater the inside diameter R of the crucible 26, the higher the surface level of the molten liquid in the vicinity of the inner wall of the crucible 26. While the surface level of the molten liquid in the vicinity of the inner wall of the crucible 26 remains high, when a semiconductor single crystal is grown, the formed semiconductor single crystal is thin near the center of the substrate and thick in the peripheral portion of the substrate. Therefore, when the crucible 26 employed in Embodiment 1 has a large inside diameter R, the rotation speed ω of the crucible 26 is reduced.

Specifically, in Embodiment 1, the rotation speed ω of the crucible 26 is adjusted to satisfy the following condition (1). That is, the rotation speed ω of the crucible 26 is adjusted in accordance with the inside diameter of the crucible 26.

$$-\omega 1 - 4 \leq \omega \leq \omega 1 + 4$$

$$\omega 1 = 10^z$$

$$z = -0.78 \log_{10}(R) + 3.1 \quad (1)$$

ω: rotation speed of the crucible (rpm)
R: inside diameter of the crucible (mm)

The ω1 of condition (1) is a value on a curve which has been drawn from the experimental results described hereinbelow. The value of ω1 depends only on the inside diameter of the crucible 26.

The range of condition (1) is represented by an arrow D1 in FIG. 4. As shown in FIG. 4, in Embodiment 1, the rotation speed ω of the crucible 26 is adjusted to fall within the range of condition (1). When the condition is satisfied, the surface level of the molten liquid in the vicinity of the inner wall of the crucible 26 does not elevate excessively.

The maximum value of the rotation speed of the crucible 26 satisfies the following condition (2).

$$\omega 1 - 4 \leq \omega \leq \omega 1 + 4$$

$$\omega 1 = 10^z$$

$$z = -0.78 \times \log_{10}(R) + 3.1 \quad (2)$$

ω: rotation speed of the crucible (rpm)
R: inside diameter of the crucible (mm)

The range of condition (2) is represented by an arrow D2 in FIG. 4. When the maximum value of the rotation speed ω of the crucible 26 falls within the range of condition (2), no substantial elevation in surface level of the molten liquid in the vicinity of the inner wall of the crucible 26 occurs.

5. Experiments 5-1. Experimental Procedure

Three crucibles 26 were having different inside diameters Rs were provided. As shown in Table 3, the inside diameters Rs were 59 mm, 115 mm, and 180 mm, respectively. Through employment of each crucible at different rotation speeds, Group III nitride semiconductor single crystals were produced. The semiconductor was GaN. The appearance of each formed single crystal was observed. Due to difference in rotation speed of the crucible 26, some single crystals were thick at the center, and other single crystals were thick at a peripheral portion.

When the inside diameter R of the crucible 26 was adjusted to 59 mm, the crucible 26 was rotated at 20 rpm, 50 rpm, and 100 rpm. When the inside diameter R of the crucible 26 was adjusted to 115 mm, the crucible 26 was rotated at 25 rpm and 50 rpm. When the inside diameter R of the crucible 26 was adjusted to 180 mm, the crucible 26 was also rotated at 25 rpm and 50 rpm.

5-2. Results of Experiments

Table 3 shows the results of experiments. In Table 3, the "center thickness T1" refers to the thickness of a Group III nitride semiconductor single crystal at the center thereof. The "peripheral thickness T2" refers to the thickness of a Group III nitride semiconductor single crystal at a peripheral portion thereof; i.e., the thickness of the single crystal near the periphery thereof. Theoretically, when the difference (T1−T2) is almost zero, the surface of the Group III nitride semiconductor single crystal is flat. In actual cases, since the average thickness varies lot by lot due to variations in growth conditions, the flatness is evaluated by a parameter (T1−T2)/T1. When (T1−T2)/T1 is greater than 0, the thickness is greater at the center, whereas when (T1−T2)/T1 is less than 0, the thickness is greater at the peripheral portion.

Through employment of the crucible 26 having an inside diameter R, a single crystal CR1 having any of the below-specified diameter was formed.

| Inside diameter R of crucible 26 | Diameter of single crystal CR1 |
|---|---|
| 59 mm | 50 mm |
| 115 mm | 1.00 mm |
| 180 mm | 152.4 mm |

Needless to say, single crystals CR1 having a diameter other than the above may be produced. However, the diameter of the single crystal CR1 is required to be slightly smaller than the inside diameter R of the crucible 26. Thus, when the crucible 26 was rotated at a rotation speed so as to satisfy conditions (1) and (2), and the diameter of the formed single crystal was 130 mm to 170 mm, a single crystal CR1 having a flat surface was obtained. As shown in Table 3, single crystals CR1s having a thickness of about 0.5 mm or more were successfully grown.

The "rotation speed (T1=T2)" in the right column of Table 3 is a rotation speed at which the center thickness T1 and the peripheral thickness T2 were the same value. The rotation speed (T1=T2) in the case where the inside diameter R of the crucible 26 was 59 mm was calculated through linear approximation with two points of (T1−T2)/T1 at 50 rpm and (T1−T2)/T1 at 100 rpm. The value of (T1−T2)/T1 at 50 rpm was calculated by averaging experimental data b to f. As a result, in the case where the inside diameter R of the crucible 26 was 59 mm, the rotation speed at which the center thickness T1 and the peripheral thickness T2 were the same value was 54 rpm.

Similarly, in the case where the inside diameter R of the crucible 26 was 115 mm, the rotation speed at which the center thickness T1 and the peripheral thickness T2 were the same value was 30 rpm. In the case where the inside diameter R of the crucible 26 was 180 mm, the rotation speed at which the center thickness T1 and the peripheral thickness T2 were the same value was 23 rpm.

TABLE 3

| Exp. | Inside diam. of crucible (mm) | Rotation speed (rpm) | Center thickness T1 (mm) | Peripheral thickness T2 (mm) | (T1 − T2)/T1 (%) | Rotation speed (T1 = T2) (rpm) |
|---|---|---|---|---|---|---|
| a | 59 | 20 | 0.862 | 0.847 | 1.7 | 54 |
| b |    | 50 | 0.625 | 0.599 | 4.2 |    |
| c |    | 50 | 0.594 | 0.602 | −1.3 |   |
| d |    | 50 | 0.757 | 0.717 | 5.3 |    |
| e |    | 50 | 0.534 | 0.509 | 4.7 |    |
| f |    | 50 | 0.633 | 0.600 | 5.2 |    |
| g |    | 100 | 0.591 | 0.868 | −46.9 |   |
| h | 115 | 25 | 0.598 | 0.545 | 8.9 | 30 |
| i |    | 50 | 0.552 | 0.731 | −32.4 |   |
| j | 180 | 25 | 0.599 | 0.619 | −3.3 | 23 |
| k |    | 50 | 0.477 | 0.655 | −37.3 |   |

Figure 5:
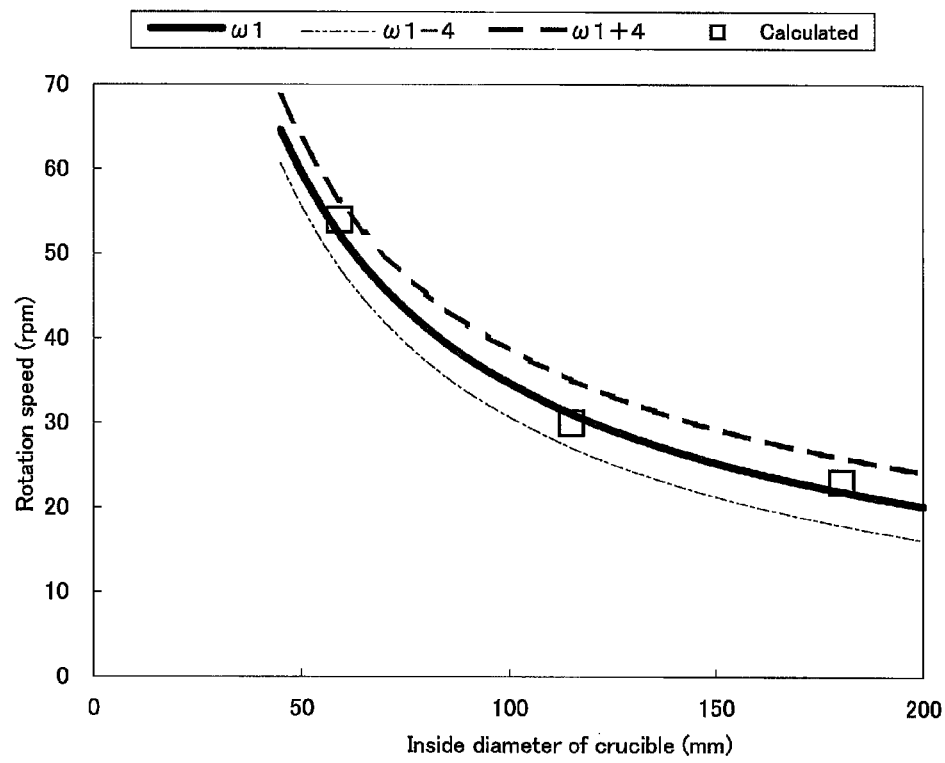
FIG. 5 is a first graph showing the relationship between the inside diameter of the crucible and the rotation speed of the crucible in the method for producing a Group III nitride semiconductor single crystal according to the Embodiment.

FIG. 5 shows the results of experiments. In FIG. 5, the horizontal axis represents the inside diameter R (mm) of the crucible, and the vertical axis represents the rotation speed ω (rpm) of the crucible. The aforementioned three points are represented by a symbol "square" in FIG. 5. That is the three points (inside diameter R of crucible 26, rotation speed) are as follows: (59 mm, 54 rpm), (115 mm, 30 rpm), and (180 mm, 23 rpm). ω1 of condition (1) is represented by a curve drawn by approximation through the above three points. In FIG. 5, ω1 of condition (1) is represented by a bold solid line. Specifically, ω1 of condition (1) was derived through least-squares approximation. The three points are plotted on a graph with the vertical and horizontal logarithmic axes, and linear regression was performed.

Also in FIG. 5, ω1−4 is represented by a broken line, and ω1−4 is represented by a dashed double-dotted line. Thus, the range of ω of condition (1) corresponds to an area defined by the broken line and the dashed double-dotted line in FIG. 5. Therefore, when a semiconductor single crystal is grown, the rotation speed ω of the crucible 26 is adjusted so as to fall within a range of ω1−4 (dashed double-dotted line in FIG. 5) to ω1+4 (broken line in FIG. 5).

Figure 6:
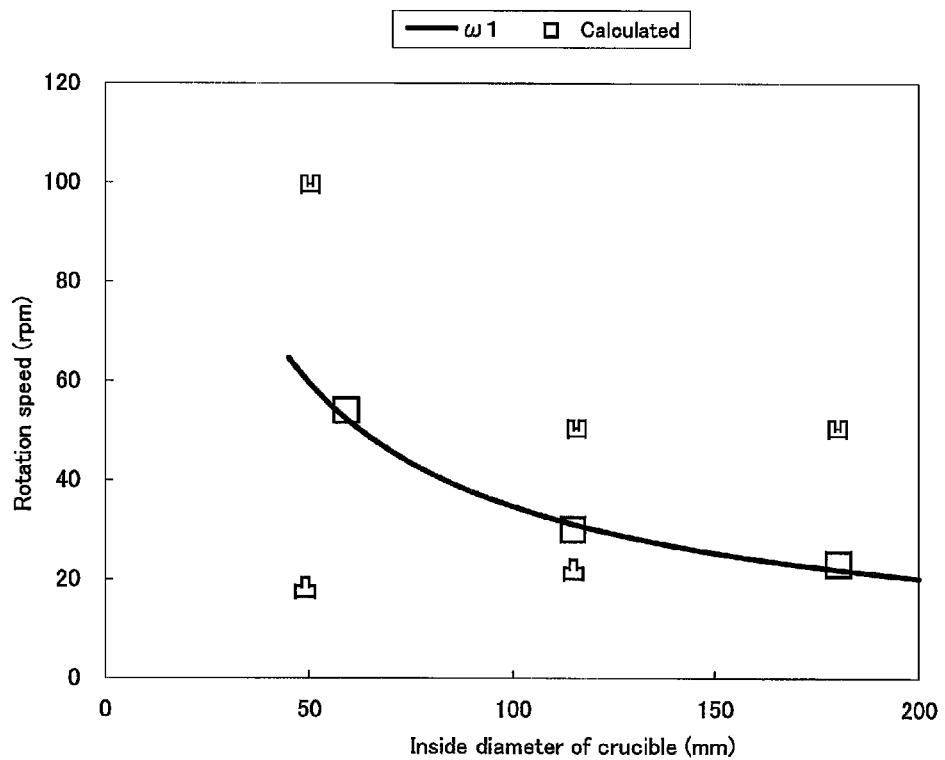
FIG. 6 is a second graph showing the relationship between the inside diameter of the crucible and the rotation speed of the crucible in the method for producing a Group III nitride semiconductor single crystal according to the Embodiment.

FIG. 6 shows the same results of the experiment in another format. In FIG. 6, a symbol "dent" refers to the semiconductor single crystal having a dent portion at the center of the substrate, and a symbol "protrusion" refers to the semiconductor single crystal protruding at the center of the substrate.

As is clear from FIG. 6, the thickness of the formed semiconductor single crystal at the center thereof tends to decrease, as the rotation speed ω (rpm) of the crucible 26 increases. This is because, during growth of a semiconductor single crystal, the surface level of the molten liquid is high at the peripheral portion of the crucible 26 and low at the center of the crucible 26. In contrast, the thickness of the formed semiconductor single crystal at the center thereof tends to increase, as the rotation speed ω (rpm) of the crucible 26 decreases. This is because, when the surface level of the molten liquid is generally flat, growth of a semiconductor single crystal is promoted at the center of the single crystal.

As described above, when the rotation speed ω is excessively high, the formed single crystal CR1 assumes a dent form, whereas when the rotation speed ω is excessively low, the formed single crystal CR1 assumes a protruded form. In Embodiment 1, a single crystal CR1 having a flat surface is grown while rise in surface level of the molten liquid in the vicinity of the inner wall of the crucible 26 is suppressed. Notably, when the rotation speed ω is low, in some cases, miscellaneous crystals may be formed on the single crystal CR1.

6. Modification 6-1. Range of Rotation Speed ω

In Embodiment 1, the maximum value of the rotation speed ω (rpm) is adjusted to fall within condition (2). However, more preferably, the rotation speed ω (rpm) is adjusted to fall within condition (3). In other words, the rotation speed ω (rpm) is set close to ω1.

$$\omega1-2 \leq \omega \leq \omega1+2$$

$$\omega1=10^z$$

$$z=-0.78 \times \log_{10}(R)+3.1 \quad (3)$$

ω: rotation speed of the crucible (rpm)
R: inside diameter of the crucible (mm)

6-2. Rotation Suspension Period

In Embodiment 1, the rotational mode shown in FIG. 4 including alternating repetition of forward rotation and reverse rotation was employed. However, a rotation suspension period in which rotation is stopped may be added to the rotation mode. Even when such a rotation suspension period is added, flowing line distribution of the molten liquid on the seed crystal surface can be modified in a time-dependent manner. In one case, a rotation suspension period may be inserted between the speed reduction period A3 and the acceleration period A4.

The direction of rotation may be limited to forward rotation. That is, the constant speed rotation period, the acceleration period, and the speed reduction period are carried out in the forward direction. Even when such a forward rotation mode is employed, a rotation suspension period in which rotation is stopped is preferably added, so that flowing line distribution of the molten liquid on the seed crystal surface can be sufficiently modified in a time-dependent manner.

6-3. Group III Nitride Semiconductor Single Crystal

In Embodiment 1, a GaN semiconductor single crystal was formed. However, the production method may be applied to the growth of other Group III nitride semiconductor single crystals. For example, $Al_X In_Y Ga_{(1-X-Y)}N$ (0≤X, 0≤Y, X+Y≤1) may be produced. In this case, additional raw material(s) must be added to the crucible 26.

6-4. Growth of a Plurality of Semiconductor Single Crystals

In Embodiment 1, one semiconductor single crystal was grown by means of a single crucible. However, a plurality of semiconductor single crystals may also be produced by means of a single crucible having a large diameter, leading to enhancement of productivity.

7. Summary of the Embodiment

As described hereinabove, in Embodiment 1; i.e., the method of the invention for producing a Group III nitride semiconductor single crystal, a single crystal was grown by a flux process. The rotation speed ω of the crucible 26 in which the template 10 for growth of a single crystal was placed was determined in accordance with the inside diameter R of the crucible 26. Therefore, the rotation speed of the crucible 26 depends only on the inside diameter R, and no additional tuning of the rotation speed of the crucible 26 is needed. Thus, a suitable semiconductor single crystal can be grown by use of a single crystal growth template 10 having any substrate diameter.

Note that Embodiment 1 is given solely for the purpose of illustration. Needless to say, those skilled in the art may change or modify the embodiment without departing from the spirit thereof. For example, in Embodiment 1, the buffer layer 12 and the GaN layer 13 were formed on the template 10 through metal-organic chemical vapor deposition (MOCVD). However, a vapor phase growth technique such as hydride vapor phase epitaxy (HVPE), a physical method such as molecular-beam epitaxy (MBE), and other, similar techniques may also be employed.

Embodiment 2

Embodiment 1 is directed to a Group III nitride semiconductor single crystal. Embodiment 2 is directed to a self-standing substrate employing the Group III nitride semiconductor single crystal, and to a semiconductor device employing the self-standing substrate.

1. Vertical-Type Semiconductor Device

Figure 7:
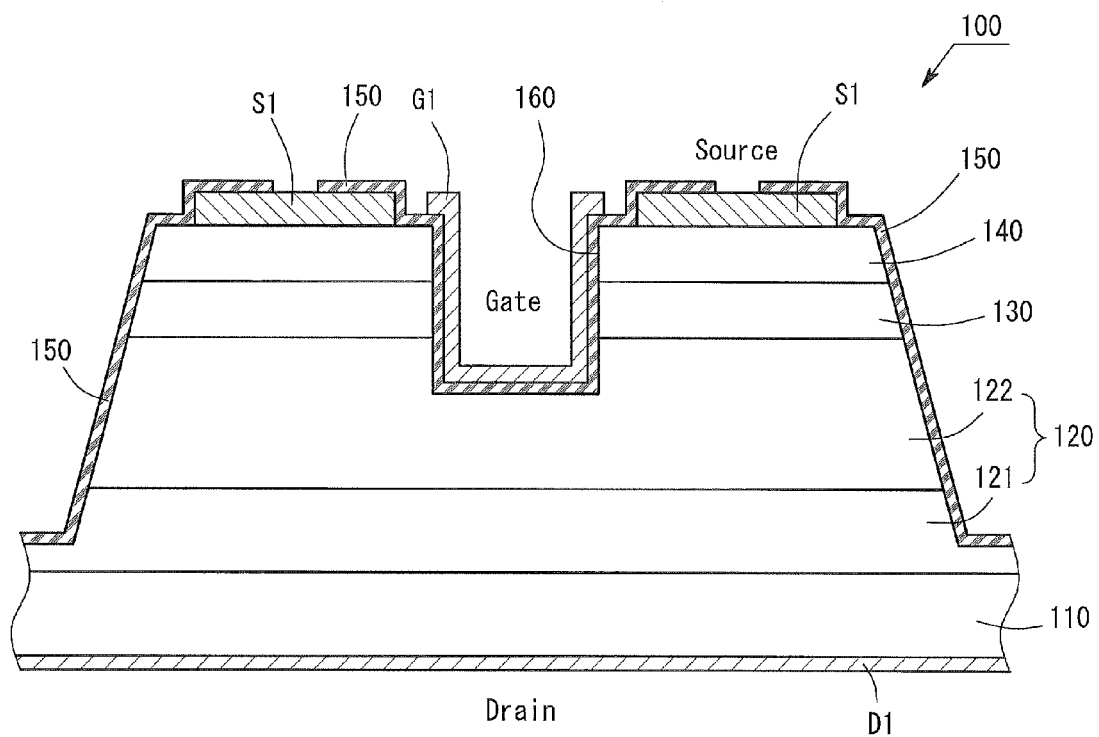
FIG. 7 is a cross-section of the structure of a vertical-type semiconductor device according to an Embodiment.

FIG. 7 shows a power device 100 according to Embodiment 2. The power device 100 is a vertical-type semiconductor device. As shown in FIG. 7, the power device 100 has a drain electrode D1, a gate electrode G1, and a source electrode S1.

The power device 100 has a plurality of Group III nitride semiconductor layers. As shown in FIG. 7, in addition to the aforementioned electrodes, the power device 100 has a substrate 110, an n-type layer 120, a p-type layer 130, an n-type layer 140, and an insulation film 150. The n-type layer 120 has an n$^+$ GaN layer 121 and an n$^-$ GaN layer 122, which are sequentially deposited on the substrate 110. A source electrode S1 is in contact with the n-type layer 140, and a drain electrode D1 is in contact with the substrate 110.

2. Self-Standing Substrate

The substrate 110 is a self-standing substrate produced from the crystal CR of Embodiment 1. As used herein, the term "self-standing substrate" encompasses a disk-shape substrate (wafer), a substrate obtained after device isolation, etc. Thus, a sapphire substrate 11 and other parts are removed from the crystal CR. The removal may be performed through a known technique such as laser lift-off. Both surfaces of the thus-obtained single crystal CR1 are polished or subjected to a similar treatment, to thereby yield the substrate 110. The substrate 110 may be provided with embossment or other shapes. Alternatively, instead of polishing both sides, at least one surface of the single crystal CR1 may be polished.

3. Modification 3-1. Lateral-Type Semiconductor Device

Figure 8:
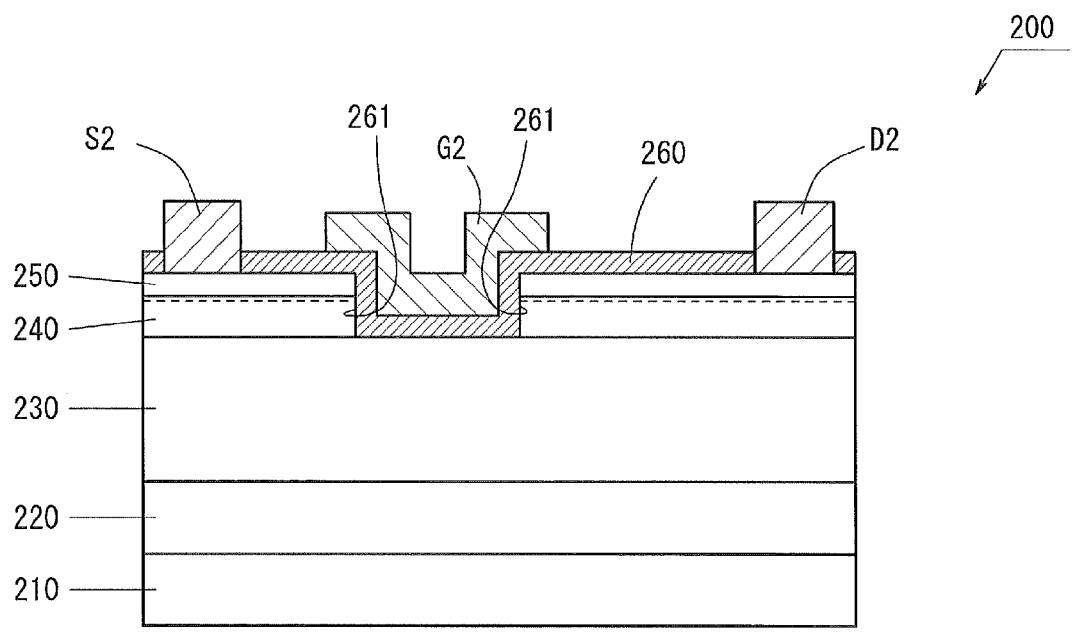
FIG. 8 is a cross-section of the structure of a lateral-type semiconductor device according to an Embodiment.

Embodiment 2 is directed to a vertical-type semiconductor device. However, the self-standing substrate of Embodiment 2 may be applied to a lateral-type semiconductor device 200 shown in FIG. 8. The semiconductor device 200 shown in FIG. 8 is an HFET. The semiconductor device 200 has a substrate 210, a buffer layer 220, a first carrier-traveling layer 230, a second carrier-traveling layer 240, a carrier supply layer 250, an insulating film 260, a drain electrode D2, a source electrode S2, and a gate electrode G2. The substrate 210 was obtained through working the single crystal CR1.

3-2. Semiconductor Light-Emitting Device

Figure 9:
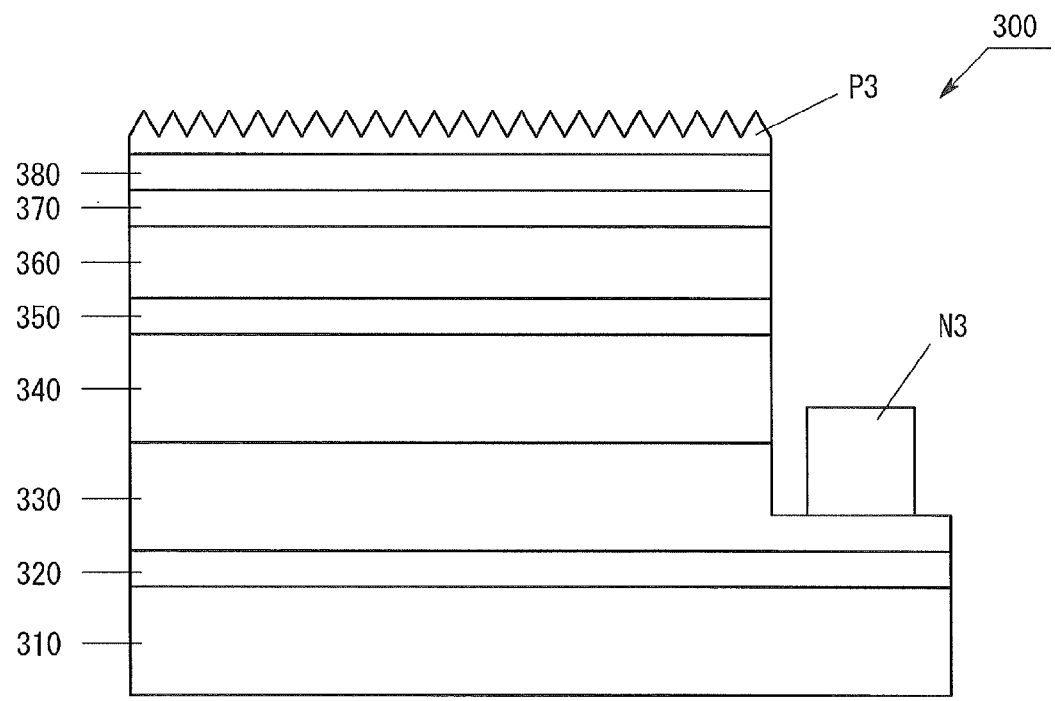
FIG. 9 is a cross-section of the structure of a semiconductor light-emitting device according to an Embodiment.

Alternatively, the self-standing substrate of Embodiment 2 may be applied to a semiconductor light-emitting device 300 shown in FIG. 9. As described above, the single crystal CR1 obtained through the production method of Embodiment 1 may be applied to a variety of semiconductor devices. The semiconductor light-emitting device 300 has a substrate 310, a semiconductor layer, a p-electrode P3, and an n-electrode N3. The substrate 310 was obtained through working the single crystal CR1.

The semiconductor layer is composed of a buffer layer 320, an n-type contact layer 330, an n-type ESD layer 340, an n-type SL layer 350, a light-emitting layer 360, a p-type cladding layer 370, and a p-type contact layer 380, which have been sequentially formed on the main surface of the substrate 310. The p-electrode P3 is in contact with the p-type contact layer 380, and the n-electrode N3 is in contact with the n-type contact layer 330.

What is claimed is:

1. A method for producing a Group III nitride semiconductor single crystal through use of a flux for growing a Group III nitride semiconductor single crystal, the method comprising:
adding a seed-crystal substrate, a flux, and semiconductor raw materials into a crucible and growing a Group III nitride semiconductor single crystal while the crucible is rotated, wherein, in the growth of the semiconductor single crystal, the crucible having an inside diameter R (mm) is rotated at a maximum rotation speed ω (rpm) satisfying the following conditions:

$$\omega 1 - 4 \leq \omega \leq \omega 1 + 4;$$

$$\omega 1 = 10^z; \text{ and}$$

$$z = -0.78 \times \log_{10}(R) + 3.1.$$

2. The Group III nitride semiconductor single crystal production method according to claim 1, wherein the growth of the semiconductor single crystal includes a constant speed rotation period in which the crucible is rotated at a constant rotation speed satisfying the following condition:

$$\omega 1 - 4 \leq \omega \leq \omega 1 + 4.$$

3. The Group III nitride semiconductor single crystal production method according to claim 2, wherein, in the constant speed rotation period, the crucible is rotated at a constant rotation speed satisfying the following condition:

$$\omega 1 - 2 \leq \omega \leq \omega 1 + 2.$$

4. The Group III nitride semiconductor single crystal production method according to claim 1, which comprises, before the growth of the semiconductor single crystal, forming a seed layer on a substrate, to thereby provide a seed-crystal substrate.

5. The Group III nitride semiconductor single crystal production method according to claim 2, which comprises, before the growth of the semiconductor single crystal, forming a seed layer on a substrate, to thereby provide a seed-crystal substrate.

6. The Group III nitride semiconductor single crystal production method according to claim 3, which comprises, before the growth of the semiconductor single crystal, forming a seed layer on a substrate, to thereby provide a seed-crystal substrate.

7. The Group III nitride semiconductor single crystal production method according to claim 2, wherein the period of rotating the crucible includes:
   an acceleration period in which the rotation speed is accelerated to the speed of the constant speed rotation period;
   a rotation suspension period in which rotation of the crucible is suspended; and
   a speed reduction period in which the rotation speed is reduced from the speed of the constant speed rotation period.

8. The Group III nitride semiconductor single crystal production method according to claim 3, wherein the period of rotating the crucible includes:
   an acceleration period in which the rotation speed is accelerated to the speed of the constant speed rotation period;
   a rotation suspension period in which rotation of the crucible is suspended; and
   a speed reduction period in which the rotation speed is reduced from the speed of the constant speed rotation period.

9. The Group III nitride semiconductor single crystal production method according to claim 5, wherein the period of rotating the crucible includes:
   an acceleration period in which the rotation speed is accelerated to the speed of the constant speed rotation period;
   a rotation suspension period in which rotation of the crucible is suspended; and
   a speed reduction period in which the rotation speed is reduced from the speed of the constant speed rotation period.

10. The Group III nitride semiconductor single crystal production method according to claim 6, wherein the period of rotating the crucible includes:
    an acceleration period in which the rotation speed is accelerated to the speed of the constant speed rotation period;
    a rotation suspension period in which rotation of the crucible is suspended; and
    a speed reduction period in which the rotation speed is reduced from the speed of the constant speed rotation period.

11. A Group III nitride semiconductor single crystal, which crystal has been grown in a crucible through a flux process, wherein the crucible having an inside diameter R (mm) is rotated at a maximum rotation speed $\omega$ (rpm) satisfying the following conditions:

$$\omega 1 - 4 \leq \omega \leq \omega 1 + 4;$$

$$\omega 1 = 10^z; \text{ and}$$

$$z = -0.78 \times \log_{10}(R) + 3.1,$$

and the single crystal has a diameter of 130 mm or more.

12. The Group III nitride semiconductor single crystal according to claim 11, which has a diameter of 170 mm or less.

13. A self-standing substrate formed by polishing at least one surface of a Group III nitride semiconductor single crystal as recited in claim 11.

14. A self-standing substrate formed by polishing at least one surface of a Group III nitride semiconductor single crystal as recited in claim 12.

15. A semiconductor device which comprises:
    a self-standing substrate as recited in claim 13;
    a Group III nitride semiconductor layer formed on the self-standing substrate; and
    an electrode which is in contact with the Group III nitride semiconductor layer or the self-standing substrate.

16. A semiconductor device which comprises:
    a self-standing substrate as recited in claim 14;
    a Group III nitride semiconductor layer formed on the self-standing substrate; and
    an electrode which is in contact with the Group III nitride semiconductor layer or the self-standing substrate.

* * * * *